United States Patent [19]

Iyer et al.

[11] Patent Number: 5,007,053
[45] Date of Patent: Apr. 9, 1991

[54] METHOD AND APPARATUS FOR CHECKSUM ADDRESS GENERATION IN A FAIL-SAFE MODULAR MEMORY

[75] Inventors: Balakrishna R. Iyer, Fremont, Calif.; Daniel M. Dias, Mahopac, N.Y.; Yitzhak Dishon, Stamford, Conn.

[73] Assignee: International Business Machines Corporation, Armonk, N.Y.

[21] Appl. No.: 278,104

[22] Filed: Nov. 30, 1988

[51] Int. Cl.$^5$ .............................................. G06F 11/10
[52] U.S. Cl. .................................. 371/21.1; 371/10.1; 371/21.5
[58] Field of Search .................... 371/21.2, 21.5, 21.2, 371/21.4, 10.1; 365/200, 201

[56] References Cited

U.S. PATENT DOCUMENTS

| | | | |
|---|---|---|---|
| 4,368,532 | 1/1983 | Imazeki | 371/21.5 |
| 4,698,808 | 10/1987 | Ishii | 371/21.5 |
| 4,726,024 | 2/1988 | Guziak | 371/21.5 |
| 4,727,544 | 2/1988 | Brunner | 371/21.5 |
| 4,782,486 | 11/1988 | Lipcon | 371/21.5 |
| 4,807,186 | 2/1989 | Ohnishi | 371/21.5 |

OTHER PUBLICATIONS

David A. Patterson, Garth Gibson, Randy H. Katz, "A Case For Redundant Arrays of Inexpensive Disks (RAID)", published in ACM SIGMOD Conference, Chicago, Ill., (May 1988).

Primary Examiner—Michael R. Fleming
Attorney, Agent, or Firm—Terry J. Ilardi; Ronald L. Drumheller

[57] ABSTRACT

A modular fail-safe memory and an address generation mechanism that provides load balancing when the memory is shared by a number of processors. A plurality of memory modules are used for the memory with no specific limit on the number of memory modules, and a checksum block is used to back-up corresponding blocks in the other memory modules. The checksum blocks are distributed across the memory modules, and an address generation mechanism determines the checksum location for a specific memory block. This address generation mechanism ensures that checksum blocks are equally divided between the memory modules so that there is no memory bottleneck, is easy to implement in hardware, and is extended to provide similar properties when a module failure occurs.

14 Claims, 3 Drawing Sheets

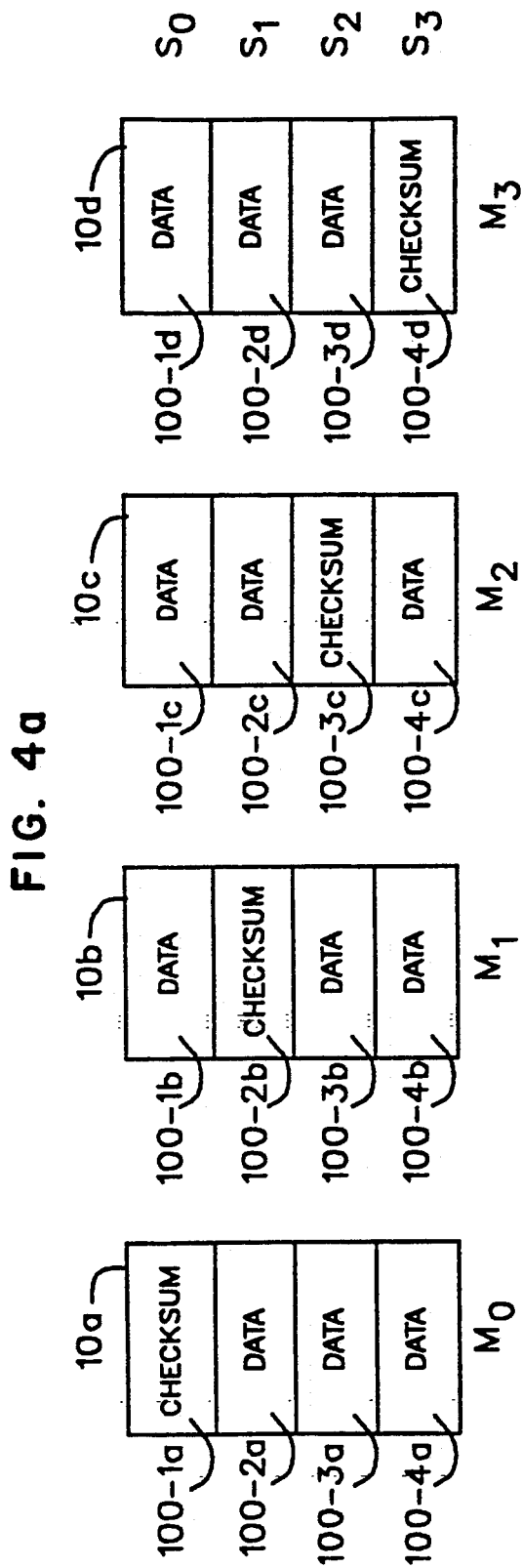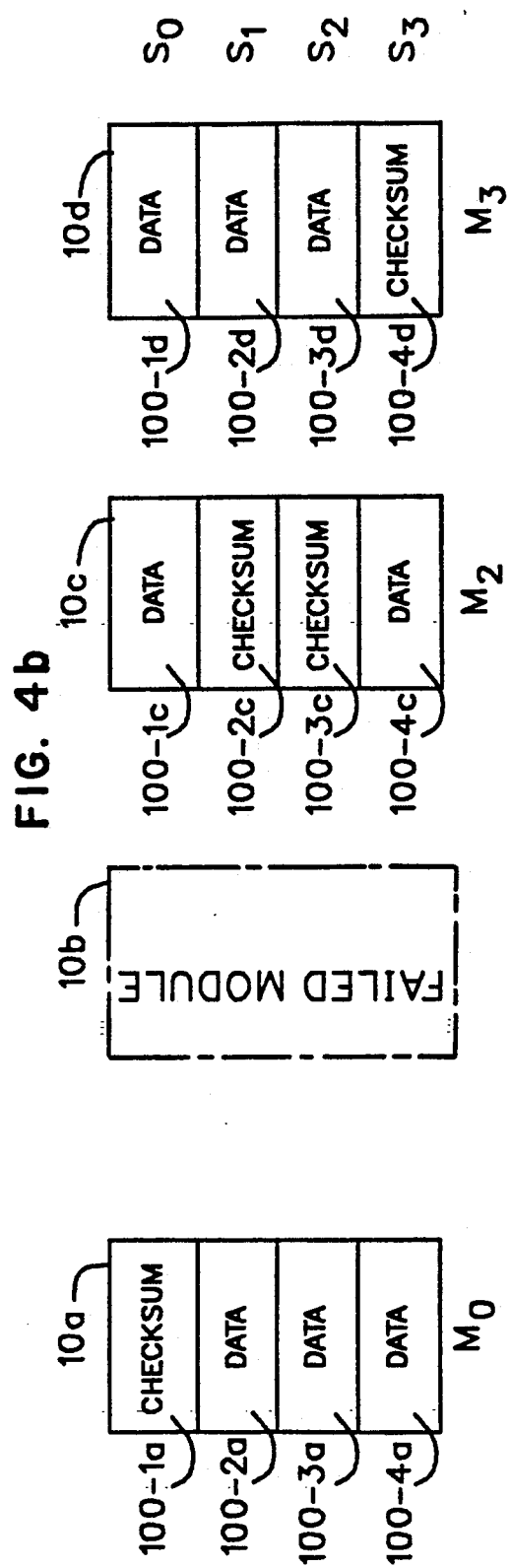

METHOD AND APPARATUS FOR CHECKSUM ADDRESS GENERATION IN A FAIL-SAFE MODULAR MEMORY

BACKGROUND OF THE INVENTION

I. Field of the Invention

This invention relates generally to fail-safe computer memories. More particularly, it relates to a method and apparatus for use in a fail-safe modular memory wherein an addressing mechanism distributes checksum blocks across memory modules to provide a load balanced fail-safe memory, and wherein after failure of a memory module the addressing mechanism redistributes checksum blocks across the remaining memory modules providing a fail-safe memory that is close to being load balanced.

II. Description of the Prior Art

As the requirements for computing power and availability grow, the interconnection of a plurality of processors to support the computing and availability requirements becomes increasingly important. Typically, multiple processors are connected to a number of shared memory modules through an interconnection network. To meet the availability requirement in such a system, it is imperative that the failure of a memory module should not cause the loss of data contained in that module, and thus cause the entire system to fail.

Tolerance to module failures in a modular memory may be achieved by declaring one of the modules as a checksum module containing checksums of data in the other modules. On a module failure the data lost may be reconstructed from the remaining modules and the checksum module, assuming that not more than one memory module fails before the lost data is reconstructed. If the checksum module fails then the checksums may be reconstructed from the data in the other modules. On every update to the memory the checksum in the checksum memory module has to be reconstructed.

While this may be a workable scheme for a uniprocessor that generates a single sequential memory request stream, the single checksum module proves to be a bottleneck for multiple processor systems that generate multiple concurrent memory write request streams at a high rate, because the checksum module is updated for every write. Thus, there is a need for a fail-safe memory that can simultaneously be accessed by a number of processors, and whose data can be reconstructed in case of failure of one module. Further, it should be easy to integrate or remove a memory module from the system.

The most relevant art relating to the solution of this problem are reviewed below.

In U.S. Pat. No. 3,876,978, Bossen et. al., one disk memory stores checksums of data located in the other disk memories. Every time data is updated, its corresponding checksum in the checksum module must be updated. Therefore, the write traffic to the checksum disk is the sum of the write traffic to all the other disks, leading to a (performance) bottleneck at the checksum disk. The present invention eliminates precisely this bottleneck.

In U.S. Pat. No. 3,742,459, entitled 'Data Processing Method and Apparatus Adapted to Sequentially Pack Error Correcting Characteristics into Memory Locations', Looschem describes a scheme whereby a fixed size codeword is generated for every memory word. Multiple codewords are packed into a location in memory. The maximum number of codewords that can be packed into a memory location determines the amount of extra memory required to store the codewords. In contrast, the present invention allows for any number of words to share the same extra word to store redundant information for fault tolerance. Another fundamental difference between U.S. Pat. No. 3,742,459 and the present invention is the following. In U.S. Pat. No. 3,742,459, the error correcting code for a word of data is such that it can correct for a few errors in the word caused by a transient fault. If the memory module in which the data word is located fails entirely, or if more than a certain number of bits of the word are corrupted, the scheme cannot recover the data. By contrast, the present invention is devised precisely to handle the failure of an entire module.

In U.S. Pat. No. 4,459,658, entitled 'Technique for Enabling Operation of a Computer System With a Consistent State of a Linked List Data Structure After a Main Memory Failure', Gabbe and Hecht describe a scheme to recover free lists in data bases where data base recovery is implemented by shadow paging—a scheme outlined in the publication "Physical Integrity in a Large Segmented Database," by R. A. Lorie in the ACM Transactions on Database Systems, Vol. 2, No. 1, March, 1977, pp. 91–104. In this scheme every data item is duplicated in two different memory locations on two different media (main memory and disk) doubling the requirement for memory. In contrast, the present invention proposes the use of only a fraction of the original memory size for storing redundant information.

Carter et. al., in U.S. Pat. No. 3,737,870 entitled 'Status Switching Arrangement', use $m+s$ of n bit memory modules to store an encoded mxn bit word. Bit parity is used to protect against module failures. If a module failure is detected, parity checking is turned off, since it could be violated; the bits from the remaining unfailed modules are read, a spare module is integrated into memory, parity recomputed and then the entire contents of the memory re-written into the new configuration of modules (unfailed modules and spare). They describe a scheme to correct the contents of the memory upon a module failure and automatically bring in one of the s spare modules to replace the one that was just lost by failure. This scheme will exhibit performance bottleneck at the memory for a plurality of processors, since all the modules need to be accessed at every memory request from any processor.

In U.S. Pat. No. 3,436,737, entitled 'Error Correcting and Repairable Data Processing', Pomerene et. al. propose the use of s spare modules along with n memory modules to store n bits of information per word. Each bit of the word is stored in a separate memory module. The $s+n$ bits represent the n bit word encoded with s bits for error correction or detection. On a module failure the bits available from the remaining modules are used to reconstruct the word. Again, all the $s+n$ memory modules need to be accessed for every memory request preventing the servicing of a plurality of concurrent memory requests from a plurality of processors, as addressed by the present invention.

In copending application Ser. No. 068,862, filed July 2, 1987 'Memory Unit Backup Using Checksum', by Y. Dishon and C. J. Georgiou, a modular organization of memory is described, with a checksum scheme. Here all the checksums are stored in one separate checksum module. Every time any memory location is updated, the checksum corresponding to this location has also to be updated in the checksum module. The write traffic to the checksum module is the sum of the write traffic to all the data modules. Hence, if identical technology is used to design all modules the checksum module is a bottleneck at any reasonable level of utilization. The alternative is to make the checksum module of higher grade technology and to provide additional bandwidth to it. This increases the cost of the memory.

In the U.S. Pat. No. 4,092,732, entitled 'System for Recovering Data Stored in Failed memory unit', by Ouchi, the unit of access is a record. A single record is divided into a number of segments and a checksum segment is added. The record segments and the checksum are on different disk drives. Now, for any read or write access, all of the segments are read or written. This implies that one access causes a seek+latence+-transfer time on each of the record segment drives and on the checksum drive. This would lead to a large load on the disks and poor throughput. By contrast, the unit of access in the present invention is a block of data that is located in a single memory module. A set of blocks has a common checksum located on some different memory module. Now each access involves only the memory module being accessed and the checksum module. This fundamental difference between the schemes leads to tremendously different performance characteristics.

SUMMARY OF THE INVENTION

In accordance with a preferred but nonetheless illustrative embodiment demonstrating objects and features of the present invention there is provided a novel addressing scheme for physical memory, in which a checksum is distributed over multiple modules instead of being stored in a single module. Write accesses to the memory modules are thus randomized and the performance bottleneck of a single checksum module is removed.

On every memory update the checksum corresponding to the updated location has to change. Since the checksums are distributed across the memory modules there is no single memory module that is inherently a bottleneck.

Accordingly it is an object of the invention to provide a fail-safe memory system that allows the reconstruction of data in case of overall failure of a memory unit that has good performance even when implemented wholly from one technology.

It is another object to provide a fail-safe memory system suitable for use in multi-processor systems.

It is still another object to provide a fail-safe memory unit using the checksum method that reduces bottlenecks caused by writing the checksum.

It is a further object to provide a method for a fail-safe memory unit using the checksum method for recovering data in the event of the failure of a single memory module.

It is still a further object to provide a method for a fail-safe memory unit using the checksum method to redistribute data and recompute and redistribute checksums upon failure of a memory module, so as to continue fail-safe operation, without creating any bottlenecks.

These, and other, objects, advantages, and features of the invention will be more apparent upon reference to the description and the appended drawings.

BRIEF DESCRIPTION OF THE DRAWINGS

FIGS. 4a and 4b are schematics showing how the checksum addresses are generated and memory reconfigured after failure of one of the memory modules.

DESCRIPTION OF THE PREFERRED EMBODIMENT

Figure 1:
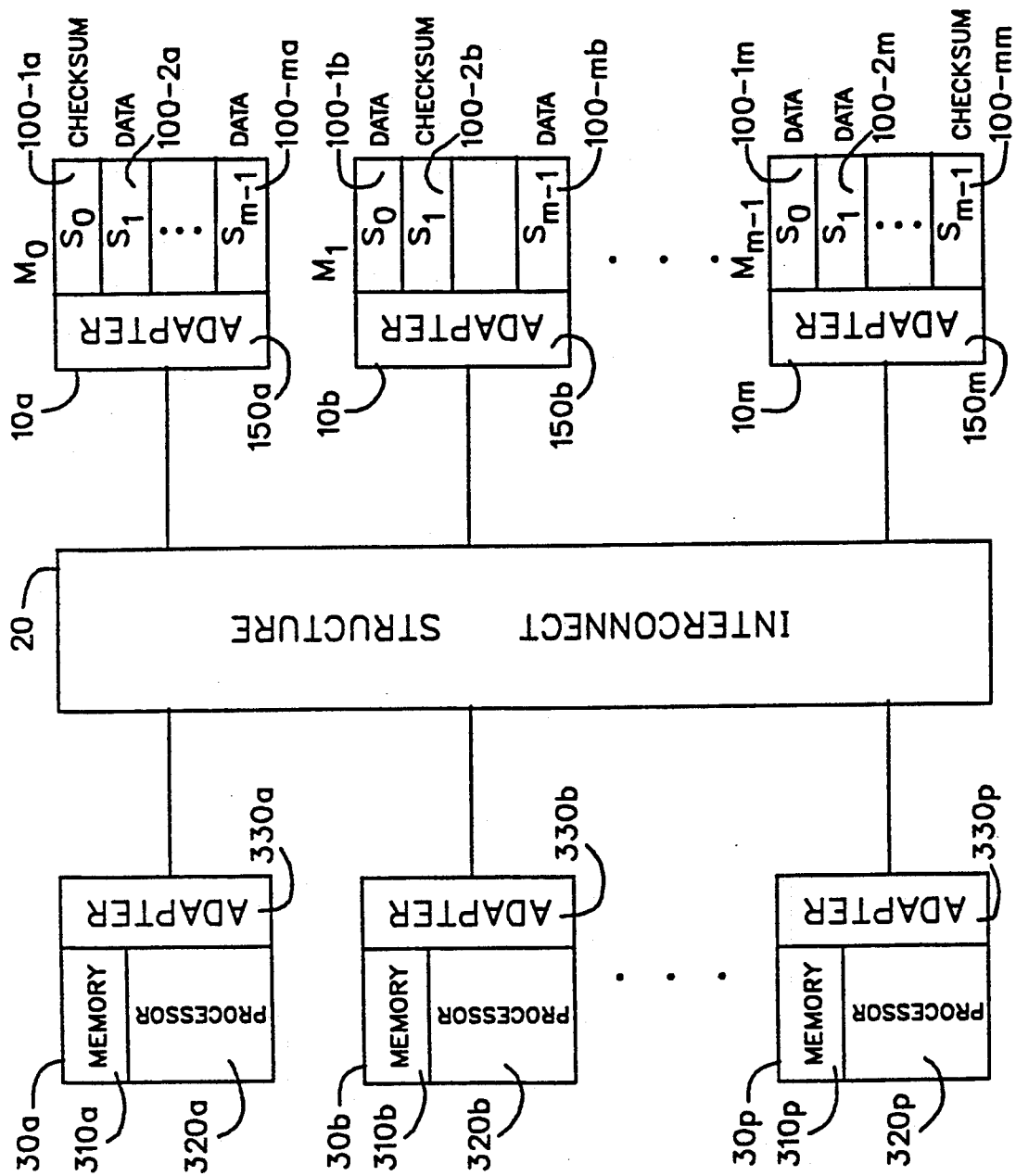
FIG. 1 is a schematic of the overall apparatus used in this invention.

FIG. 1 shows a block diagram of the processors 30a-p, interconnect structure 20, and memory modules 10a-m that embody this invention. A plurality of processors 30a through 30p, where p is an arbitrary positive integer, are connected to a plurality of memory modules 10a through 10m, where m is any arbitrary positive integer, through an interconnection network 20. Note that the number of processors may be different from the number of memory modules. Each processor 30a through 30p is connected to the interconnection structure by a processor adapter 330a through 330p and similarly, each memory module 10a through 10m is connected to the interconnection structure through a memory adapter 150a through 150m.

The figure shows the case of m memory modules, denoted as $M_0$ through $M_{m-1}$ and labeled as 10a through 10m. Each memory module, for example 10a, is partitioned into m sections denoted as $S_0$ through $S_{m-1}$ and labeled as 100-1a through 100-ma. In each memory module, one section, $S_k$, contains the checksums of the same numbered sections of all other memory modules, which contain data. For example, in memory module $M_0$ labeled 10a, Section $S_0$ labeled 100-1a contains the checksums of data contained in sections $S_0$ labeled 100-1b, ..., 100-1m, of all other memory modules $M_1$, ... $M_{m-1}$, respectively, labeled as 10b through 10m.

Thus in general, in memory module $M_i$, section $S_i$ is a checksum section that backs up sections $S_i$ of all the other modules that contain data. This scheme will be further generalized hereinbelow to include any number of sections per memory module.

In this description it is assumed that memory accesses are at the granularity of a BLOCK of data of size B. A typical value for B is 4K (i.e., 4096) bytes of data. More specifically, each section of a memory module (see above) is divided into an integer number of blocks of data. Those skilled in the art will appreciate that the present invention can be readily adapted to an arbitrary size for a block of data. This description is for an arbitrary number N of processors. Again, those skilled in the art will appreciate that the present invention can be readily adapted to a single processor (i.e. N=1), in which the processor can have several outstanding requests to the memory.

Figure 2:
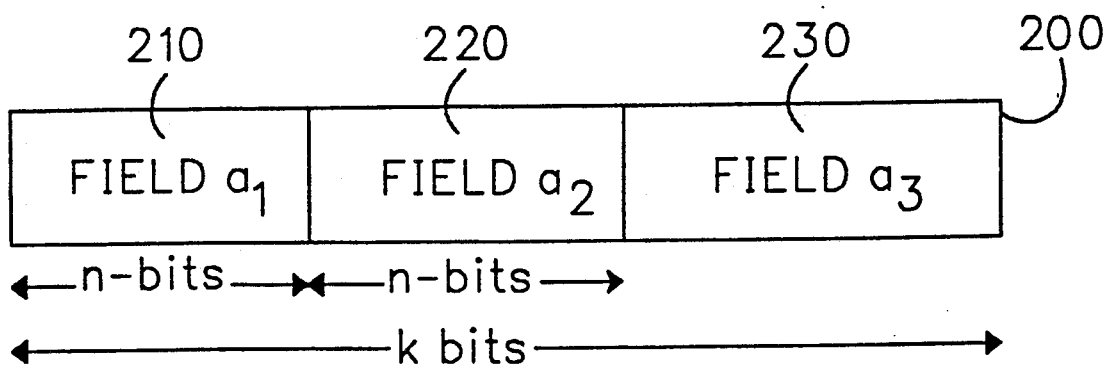
FIG. 2 is a schematic showing how data addresses are generated.

FIG. 2 shows the interpretation of an address 200 for a data block contained in the memory modules. More specifically, the total address space (of all the memory modules together) is assumed to be $2^k$ blocks of data, equally distributed among $M=2^n$ memory modules, where k and n are positive integers, k being required to be greater than or equal to 2n. Thus, each memory module has $2^{k-n}$ data blocks. To address any block, an address is defined that selects a memory module, a section contained within that memory module and a data block contained within that section. The structure of such an address is shown in FIG. 2.

As shown in FIG. 2, the k-bit address 200 for any block is divided into three fields: 210 denoted as $a_1$, 220 denoted as $a_2$, and 230 denoted as $a_3$. The field 210 ($a_1$) is of n-bits, field 220 ($a_2$) is also of n-bits, and field 230 ($a_3$) is of k-2n bits. More specifically, the most significant n bits of the address constitute field 210 ($a_1$), the next most significant n bits of the address constitute field 220 ($a_2$) and the least significant k-2n bits constitute field 230 ($a_3$). Field 220 ($a_2$) represents the memory module address. That is, if the value of the binary representation of field 220 ($a_2$) is i, then the addressed block is in memory module $M_i$. The concatenation of fields $a_1$ 210 and $a_3$ 230 (with $a_1$ as the most significant n-bits) represents the binary address of the addressed block within memory module $M_{a2}$. Thus, field $a_1$ 210 represents the address of a section within the memory module defined by field $a_2$ 220, and $a_3$ 230 represents the address of the block within the section defined by field $a_1$ 210. That is, if the binary representation of $a_1$ 210 is j, then the addressed block is in section $S_j$, and if the binary representation of $a_3$ 230 is q, then the q'th consecutive block within section $S_j$ is addressed.

The manner in which the checksum address is generated from an address with the fields $a_1$, $a_2$ and $a_3$, is as follows. The corresponding checksum block is found in module $M_{a1}$ in section $S_{a1}$ at displacement $a_3$ within the section. Thus blocks with addresses $a_1 = a_2$ are checksum blocks. These checksum blocks are not used for data. Those skilled in the art will appreciate that this can be achieved by omitting these blocks from the pool of available blocks when the system is initialized, so that these blocks will not be used by the operating system in allocating virtual pages to physical blocks of memory.

The checksum for a block addressed by $a_1a_1a_3$, that is in memory module $M_{a1}$, section $S_{a1}$ and displacement $a_3$ will be denoted as $C_{a_1a_1a_3}$. In general, a checksum block is denoted as $C_{ij}$ with $a_1 = i$, and $a_3 = j$. Similarly a data block is denoted at $D_{ikj}$ with fields $a_1 = i$, $a_2 = k$ and $a_3 = j$. The checksum at block $C_{ij}$ is described as follows:

$$C_{ij} = D_{i0j} \oplus D_{i1j} \oplus \ldots D_{i(i-1)j} \oplus D_{i(i+1)j} \cdots \oplus D_{(m-1)j}$$

that is, the checksum $C_{ij}$ is obtained by the bitwise modulo 2 addition of all blocks at address ij of modules $M_0$, $M_1$, ... $M_{(i-1)}$, $M_{(i+1)}$, ... $M_{(m-1)}$.

The new checksum $C_{ij}^{new}$ required when a block $D_{ikj}^{old}$ in module k is updated to a new value $D_{ikj}^{new}$ can be generated efficiently by noting that sor adapter 330 presents this address and command code to the interconnection network 20, which uses field $a_2$ 220 (FIG. 2) to connect the processor adapter 330 to the selected memory module's ($M_{a2}$) memory adapter 150. Assuming the connection is successfully established, the memory adapter 150 then retrieves the block addressed by fields $a_1$ 210 and $a_3$ 230 from the memory module ($M_{a2}$) 10 and transfers the block to the processor adapter 330 over the same connection. The processor adapter 330 then stores the block in the processor's local memory 310 at a location indicated by the processor 320. At the conclusion of the data transfer, the interconnection structure is signalled to remove the connection between the processor adapter 330 and the memory adapter 150. Note that the checksum block is not involved in a read access to the memory 10.

If the interconnect structure 20 cannot establish a connection to the selected memory adapter 150, it so indicates to the requesting processor adapter 330. The processor adapter 330 then retries the connect request after an appropriate back-off interval.

For a write access by a processor 320 to the memory 10, the processor 320 places the address of the write block 200 (i.e., fields $a_1$, $a_2$ and $a_3$) and a command code indicating a write request in the processor adapter 330. As for the read access, the processor adapter 330 presents this address 200 and command code to the interconnection network 20, which uses field $a_2$ 220 to connect the processor adapter 330 to the selected memory module's ($M_{a2}$) memory adapter 150. Assuming the connection is successfully established, the memory adapter 150 uses field $a_1$ 210 to determine the memory module ($M_{a1}$) 10 that contains the checksum for this block. Next, the memory module 10 ($M_{a2}$) attempts to establish a connection to the memory module ($M_{a1}$) 10 that contains the required checksum section. If this connection cannot be established (i.e., the memory module 10 containing the checksum section is busy at this time) then the memory adapter 150 indicates "busy" to the processor adapter 330 and the connection with the processor adapter 330 is removed by the interconnection network 20. The entire write operation is then retried after waiting for a time duration referred to as a back-off interval. If the connection to the memory module 10 containing the checksum section is established, then the memory adapter 150 indicates to the processor adapter 330 "proceed". The processor adapter 330 then retrieves the data block from the local memory 310 of the processor 30 and transfers this block to the memory adapter 150. The memory adapter 150 uses fields $a_1$ 210

$$C_{ij}^{new} = (D_{ikj}^{old} \oplus D_{ikj}^{new}) \oplus C_{ij}^{old} \text{ since } C_{ij}^{new} = D_{i0j} \oplus D_{i1j} \ldots \oplus D_{ikj}^{new} \ldots \oplus D_{i(i-1)j} \oplus D_{i(i+1)j} \cdots \oplus D_{i(m-1)j}$$

$$(D_{ikj}^{old} \oplus D_{ikj}^{new}) \oplus (D_{i0j} \oplus D_{i1j} \ldots \oplus D_{ikj}^{old} \ldots \oplus D_{i(i-1)j} \oplus D_{i(i+1)j} \cdots \oplus D_{i(m-1)j}) = (D_{ikj}^{old} \oplus D_{ikj}^{new}) \oplus C_{ij}^{old}$$

Thus, this method requires only two transfers over the interconnect structure 20 to store the data and its checksum: one to transfer new data $D_{ikj}^{new}$ to memory module k where it is exclusive ORed (modulo 2 addition) with old data $D_{ikj}^{old}$, and a second transfer of the partial checksum $(D_{ikj}^{new} \oplus D_{ikj}^{old})$ to the memory module that contains the checksum, where the partial checksum $(D_{ikj}^{new} \oplus D_{ikj}^{old})$ is exclusive ORed with the old checksum $C_{ij}^{old}$ to obtain the new checksum $C_{ij}^{new}$.

For a read access of a block by a processor 30, as in FIG. 1, the processor 30 places the block address (i.e., fields $a_1$, $a_2$ and $a_3$) and a command code indicating a read request in the processor adapter 330. The procesand $a_3$ 230 to select the memory section and data block within the section. Using pipelining techniques, the memory adapter 150 concurrently generates the partial checksum $(D_{ikj}^{new} \oplus D_{ikj}^{old})$ (using the same notation as the description of how the checksum is formed) which is transferred to the checksum memory module $M_{a1}$ 10, and stores the new data $D_{ikj}^{new}$ in the memory module $M_{a2}$ 10. At the memory module $M_{a1}$ 10 that contains the checksum, the memory adapter 150 retrieves the old checksum $C_{ij}^{old}$ and exclusive ORs it with the partial checksum $(D_{ikj}^{new} \oplus D_{ikj}^{old})$ received, thus generating the new checksum which is stored in place of the checksum $C_{ij}^{old}$.

Figure 3:
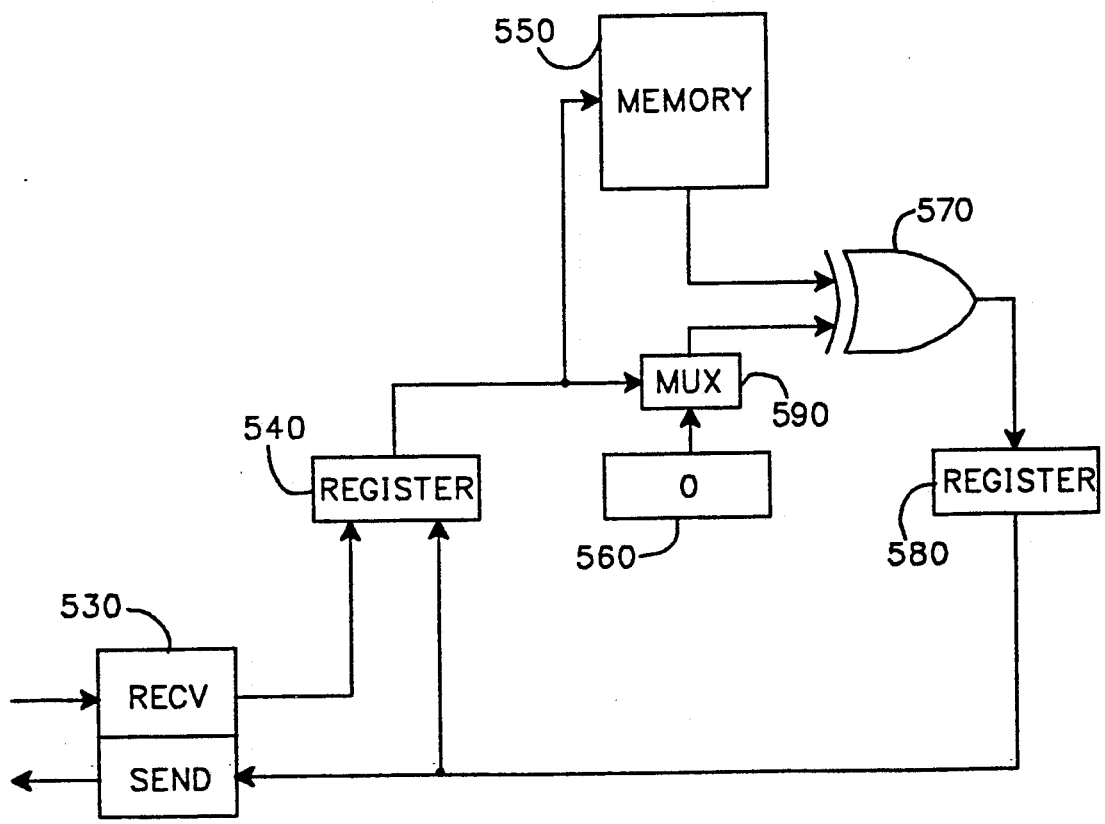
FIG. 3 is a schematic showing how the new checksum is generated from the old data, old checksum and the new data block.

Refer now to FIG. 3, which shows the implementation of the partial checksum generation at one memory module or any subunit. Such mechanism may be integrated into a memory chip with the appropriate controls. Note that the implementation is applicable to both the memory module containing the data and that containing the checksum. Data to be fetched for the processor are fetched from memory 550 and exclusive ORed with 0 from register 560 which permits them to retain their original value. This data is then saved in register 580 from where it is transmitted to the processor adapter 330 over port 530. Data to be written is received from interconnect structure 20 on port 530 and is saved in register 540. The old data are fetched from memory 550 and are then exclusive ORed at gate 570 with the data in register 540. The result is saved in register 580 from which it is transmitted to the memory module containing the checksum data over port 530. The new data are concurrently stored from register 540 into memory 550. At the memory module containing the checksum, the corresponding (exclusive or-ed) data are received at port 530 and saved in register 540. The old checksum data are fetched from memory 550 and are then exclusive ORed at gate 570 with the data in register 540. The result is saved in register 580. The data in register 580 are then transferred to register 540 and then stored in memory 550 as the new checksum. Those skilled in the art will appreciate that the data in register 580 could be stored directly in memory 550. In this manner, the entire new block and checksum block are written into the corresponding data and checksum memories. Thus the update to the data memory, and to the checksum memory occur concurrently, in a pipelined fashion. Finally, when the writes of the data and checksum blocks are complete, the connections between the memory adapters 150 and between the processor adapter 330 and memory adapters 150 are removed.

Those skilled in the art will recognize that the unit of retrieval and storage into the memory module may be any multiple of bytes. Thus the operations above are for illustrative purpose only.

The operation after the failure of a memory module is now described. Suppose that memory module $M_i$ fails and is configured out of the system. On detection of the failure, the contents of each block in the failed memory module are recreated by performing an exclusive-OR of the contents of the corresponding blocks in the other memory modules. Those skilled in the art will appreciate that these recreated blocks can be written out to the corresponding blocks on Disk storage as determined by the virtual address of the blocks (unless a copy of the block already exists on Disk). In this manner all blocks of the failed memory are written to Disk. When each block of the lost module is reconstructed, it is exclusive or-ed with the current value of the checksum, to produce a new checksum that corresponds to the checksum of the existing memory modules. (If a memory module failure occurs during transfer of a block then that block cannot be reconstructed from the old checksum but, as known in the art, can be retrieved from the sending processor using appropriate signaling.) The memory now has a checksum corresponding to each section except for section $S_i$ that was located in the failing memory module $M_i$. The memory can now be operated in the same manner as described earlier, except that if a block write occurs for which the checksum block is in the failed memory module, the new data block is merely written without checksum creation. When the failing memory module $M_i$ is repaired and is to be inserted back into the system, all its blocks are first initialized to all zeros. Then, the checksum of section $S_i$ is recreated by doing an exclusive-OR of the corresponding data of section $S_i$ in the other memory modules. The system then reverts to normal operation with all sections backed up, as described earlier.

With the failure reconfiguration as described in the preceding paragraph, section $S_i$ has no checksum after memory module $M_i$ fails. Hence, if another memory module failure occurs now, before the failing memory module is reconfigured into the system, the data in section $S_i$ of the failed memory modules is lost. The following reconfiguration scheme changes the addressing and location of checksums so that after the failure of a memory module and the memory reconfiguration, all sections have a backup checksum; if another memory module fails after reconfiguration no data is lost. After failure of a memory module $M_i$, the checksum for section $S_i$ assigned previously to the failed module has to be assigned to a nonfailed module. This is done by choosing module $M_{i+1 \bmod m}$ to locate the checksum for section $S_i$. If module $M_{i+1 \bmod m}$ is also a failed module, then module $M_{i+2 \bmod m}$ is chosen, and so on. More specifically, a simple function called $cyc(a_1)$ is defined as the module whose module address is the smallest (cyclically) address greater than or equal to $a_1$ for which there is an existing memory module. That is $cyc(a_1)$ equals $a_1$ if memory module $M_{a1}$ is active, otherwise $cyc(a_1)$ equals $(a_1+1) \bmod m$ if module $M_{(a1+1) \bmod m}$ is active, and so on. A block $(a_1, a_2, a_3)$ exists only if the module $M_{a2}$ is a non-failed module. It's checksum is found in location $(a_1, cyc(a_1), a_3)$. All locations of the form $(a_1, cyc(a_1), a_3)$ contain checksums and will be marked as unavailable during system IPL along with the physical memory addresses spanning missing memory modules. Hence if memory module $M_{a2}$ is missing then all addresses of the form $(a_1, a_2, a_3)$ will be marked as missing from the address space.

An illustration of the memory addressing scheme before and after failure of memory module $M_1$ is given in FIG. 4. Before failure, we show an example where the memory system consisting of four memory modules (10a, 10b, 10c, and 10d) in FIG. 4a. The checksums for the three sections 100-1b, 100-1c, 100-1d in modules 10b, 10c, and 10d, respectively, are contained in section 100-1a in module 10a. Similarly, checksums for sections 100-2a, 100-2c, and 100-2d, is stored in section 100-2b. Checksums for sections 100-3a, 100-3b, and 100-3d are stored in section 100-3c. Finally, checksums for sections 100-4a, 100-4b, and 100-4c are stored in section 100-4d. Each module has equal number of checksum sections.

The operation after a memory module failure is as follows. The initial actions are exactly the same as described earlier for failure. Again, suppose that memory module $M_i$ fails and is configured out of the system. On detection of the failure, the contents of each section in the failed memory module are recreated by performing an exclusive-OR of the contents of the corresponding sections in the other memory modules. As before, these recreated sections can be written out to the corresponding space on Disk storage as determined by the virtual address of the pages (unless a copy of the section already exists on Disk). In this manner all sections of the failed memory are written to Disk. Specifically, consider the failure of module 10b, in FIG. 4. Lost data is recreated as follows: Data in section 100-1b, is recreated by an XOR of the contents of data in sections 100-1c, 100-1d, and the checksum 100-1a. Data in section 100-3b, is recreated by an XOR of the contents of data in sections 100-3a, 100-3d, and the checksum 100-3c. Data in section 100-4b, is recreated by an XOR of the contents of data in sections 100-4a, 100-4c, and the checksum 100-4d. When each data section of the lost module is reconstructed, it is exclusive or-ed with the current value of its checksum segment, to produce a new checksum that corresponds to the checksum of the data segments in non-failed memory modules. In the example of FIG. 4.: data recreated for section 100-1b is exclusive or'ed with section 100-1a to form the new checksum for sections 100-1c and 100-1d and stored in section 100-1a. Data recreated for section 100-3b is exclusive or'ed with section 100-3c and stored therein. Data recreated for section 100-4b is exclusive or'ed with section 100-4d and stored therein. (As before, if a memory module failure occurs during transfer of a block then that block cannot be reconstructed from the checksum but, as known in the art, can be retrieved from the sending processor using appropriate signaling.)

After the data is recreated and checksum recomputed the memory has a checksum corresponding to each section except for section $S_i$ that was located in the failing memory module $M_i$. The checksum for section $S_i$ is to be located in module $M_{cyc(i)}$. Section $S_i$ of module $M_{cyc(i)}$ is written out to Disk. In the example of FIG. 4., section 100-2c is converted into a checksum section; the sections 100-1b, 100-2b, 100-3b, and 100-4b, and 100-2c are removed from the physical address space of the computer memory; data in section 100-2c is written to disk. The new checksum section locations are described in FIG. 4b. Then the checksum for section $S_i$ is created by an exclusive-OR of the data in section $S_i$ in all existing modules except module $M_{cyc}(i)$. In our example, checksums for sections 100-2a, and 100-2d are computed and stored in section 100-2c. Now, all the checksums are available, and the reconfiguration is complete. Those skilled in the art can appreciate how our specific example generalizes to an arbitrary number of memory modules and sections.

The operations for read and write after reconfiguration are the same as the case with all memory modules active, except that if the checksum is computed to be in a failed module $M_i$, then it is located in module $M_{cyc(i)}$. There is a small amount of load imbalance when some memory module is not active because although every memory module contains checksums the checksums are not equally divided. On the average case the skews will not be much and except in pathological cases this scheme shows considerably better performance over the scheme in which all the checksums are stored in a single memory module.

In the above description it was assumed that the module and checksum locator bits, ($a_1$, $a_2$), are the most significant bits of the block address. The addressing is easily generalized so that these bits are "middle-order bits" of the block address. Now the address could be represented as ($a_0$, $a_1$, $a_2$, $a_3$), with module number determined by $a_2$, address within the module by ($a_0$, $a_1$, $a_3$), and checksum for block ($a_0$, $a_1$, $a_2$, $a_3$) located at block ($a_0$, $a_1$, $a_1$, $a_3$). For instance, if $a_3$ is 12 bits, then 4K blocks will be interleaved across modules, and checksums will be equally distributed across the modules. This would tend to improve load balance among the modules because different processors are likely to access different sections, relatively randomly across the modules.

While the invention has been described in its preferred embodiment, it is to be understood that changes in form and details of the above description may be made without departing from the true scope and spirit of the invention.

We claim:

1. A method for providing fault tolerance for a memory for a computer system comprised of a plurality of memory modules having a plurality of groups of blocks, said groups of blocks being comprised of at least one backup block for storing checksums and a plurality of data blocks for storing data, said blocks in each of the said memory modules having various address labels, and wherein a unit of access is no greater than a block, said method comprising the steps of;
   distributing said backup blocks for different groups of data blocks across said memory modules;
   providing an address generator to identify the address label of the data in a data block and the address label of said data block's backup block;
   calculating a checksum of the data in all of said data blocks of a group of blocks;
   storing said checksum in an identified backup block having an identified address label;
   detecting failure of a memory module; and
   recovering the data in each one of the data blocks in said failed memory module from the other blocks in non-failed memory modules.

2. The method according to claim 1 further comprising the step of recalculating and redistributing checksums and data in case of a module failure, said redistribution allowing continued fail-safe operation of memory.

3. The method according to claim 2 wherein each block of said group of blocks is assigned one per memory module.

4. The method according to claim 3 wherein each block consists of a plurality of bits arranged sequentially, and said checksum of data blocks in a group of blocks is calculated according to modulo 2 addition of a group of bits, one bit per data block in the group of blocks, at the same sequential displacement from the start of the block.

5. The method according to claim 4 wherein said checksum calculation comprises the steps of:
   calculating a partial checksum of new data and old data at a memory block in memory module;
   calculating a new checksum from said partial checksum and a checksum previously stored in said backup memory block;
   said step of storing comprises storing said new checksum in said backup memory block.

6. The method according to claim 2 wherein the memory block address consists of four fields ($a_0$, $a_1$, $a_2$, $a_3$), said fields each consisting of a plurality of bits, wherein said fields $a_1$ and $a_2$ each have the same number of bits, wherein field $a_2$ identifies the memory module containing the block, wherein fields ($a_0$, $a_1$, $a_3$) identify the address of the block within said identified module, and wherein said address generator determines an address of said backup block for a data block as ($a_0$, $a_1$, $a_1$, $a_3$).

7. The method for providing fault tolerance to memory according to claim 6 wherein the memory modules are arranged in a cyclic order and wherein the address of the backup block for a data block with address label $(a_0, a_1, a_2, a_3)$ is the block in module $a_1$ with address label $(a_0, a_1, a_3)$ within said identified module provided that said identified module has not failed, and if said identified module has failed then said backup block has the same identified address label within a next memory module in cyclic order.

8. A memory for a computer system comprising:
a plurality of memory modules:
each of said memory modules having either a non-failed status or a failed status;
each of said memory modules being partitioned into a plurality of memory sections;
said memory sections being associated with each other into groups of memory sections, each said memory section group comprising a single memory section from each of a plurality of different ones of said memory modules;
one of said memory sections in each one of said groups of memory sections being used for storing checksum data for use in recovering data in failed memory modules without duplication of data;
said memory sections used to store checksum data being distributed among said memory modules, whereby access to said memory modules for the reading and writing of checksum data is distributed among said memory modules.

9. A memory as defined in claim 8 wherein said memory section used to store checksum data for each group of memory sections is a memory section in a memory module having a non-failed status.

10. A memory as defined in claim 8 wherein said memory sections are all the same size.

11. A memory as defined in claim 8 wherein each said memory section group comprises a single memory section from each of said memory modules.

12. A memory as defined in claim 8 wherein said memory section used to store checksum data for a group of memory sections is determined by a portion of the common address bits for said group of memory sections.

13. A memory as defined in claim 8 wherein a memory module is identified by a distinct group of address bits, a memory section within a memory module is identified by another distinct group of address bits, and a memory location within a memory section is identified by still another distinct group of address bits.

14. A memory as defined in claim 13 wherein said distinct group of address bits used to identify a memory section within a memory module is also used to identify the memory module containing the memory section used to store checksum data for said identified memory section.

* * * * *